(12) United States Patent
Chern et al.

(10) Patent No.: US 8,432,204 B1
(45) Date of Patent: Apr. 30, 2013

(54) CURRENT-CONTROLLED OSCILLATOR (CCO) BASED PLL

(75) Inventors: Chan-Hong Chern, Palo Alto, CA (US);
Ming-Chieh Huang, San Jose, CA (US);
Tao Wen Chung, San Jose, CA (US);
Chih-Chang Lin, San Jose, CA (US);
Yuwen Swei, Fremont, CA (US);
Fu-Lung Hsueh, Kaohsiung (TW)

(73) Assignee: Taiwan Semiconductor Manufacturing Co., Ltd., Hsin-chu (TW)

( * ) Notice: Subject to any disclaimer, the term of this patent is extended or adjusted under 35 U.S.C. 154(b) by 0 days.

(21) Appl. No.: 13/344,637

(22) Filed: Jan. 6, 2012

(51) Int. Cl.
*H03L 7/06* (2006.01)

(52) U.S. Cl.
USPC .......................................... 327/157; 327/148

(58) Field of Classification Search ................... 327/148, 327/157
See application file for complete search history.

(56) References Cited

U.S. PATENT DOCUMENTS

| | | | |
|---|---|---|---|
| 6,727,768 B1 | 4/2004 | Dasgupta | |
| 7,352,249 B2 | 4/2008 | Balboni et al. | |
| 7,420,427 B2 * | 9/2008 | Brown et al. | 331/16 |
| 7,808,288 B2 | 10/2010 | Chatterjee | |
| 8,134,417 B2 * | 3/2012 | Chiang et al. | 331/109 |
| 2005/0073369 A1 | 4/2005 | Balboni et al. | |
| 2006/0214737 A1 * | 9/2006 | Brown et al. | 331/16 |
| 2007/0057736 A1 * | 3/2007 | Baird et al. | 331/16 |
| 2008/0238505 A1 | 10/2008 | Chatterjee | |
| 2009/0325521 A1 * | 12/2009 | Dubash et al. | 455/150.1 |
| 2011/0298507 A1 * | 12/2011 | Jakobsson et al. | 327/156 |
| 2011/0304407 A1 * | 12/2011 | Chiang et al. | 331/182 |
| 2012/0194369 A1 * | 8/2012 | Galton et al. | 341/120 |
| 2012/0201289 A1 * | 8/2012 | Abdalla et al. | 375/233 |
| 2012/0249198 A1 * | 10/2012 | Sinha et al. | 327/157 |

\* cited by examiner

*Primary Examiner* — Adam Houston
(74) *Attorney, Agent, or Firm* — Duane Morris LLP

(57) ABSTRACT

A PLL circuit includes a phase frequency detector; a programmable charge pump coupled to an output of the phase frequency detector; a loop filter coupled to an output of the charge pump, the loop filter providing a fine tuning voltage; a first voltage-to-current converter, the first voltage-to-current converter providing a fine tuning current corresponding to the fine tuning voltage; a current-controlled oscillator (CCO); a feedback divider coupled to an output of the CCO and an input of the phase frequency detector; and an analog calibration circuit. The analog calibration circuit provides a coarse adjustment current for coarse adjustments to a frequency pivot point for an oscillator frequency of the CCO, wherein the CCO generates a frequency signal at an output responsive to a summed coarse adjustment and fine tuning current, wherein the frequency pivot point is continuously adjustable.

20 Claims, 14 Drawing Sheets

CURRENT-CONTROLLED OSCILLATOR (CCO) BASED PLL

TECHNICAL FIELD

The embodiments described herein relate to phase-locked loops (PPLs), and more specifically to current controlled oscillator (CCO) based PLLS.

BACKGROUND OF THE INVENTION

Phase-locked loops are used in a variety of applications such as clock recovery, frequency and phase modulation, and frequency synthesizers. Designs use either a voltage-controlled oscillator (VCO) or a current-controlled oscillator (CCO) with an accompanying voltage-to-current (V2I) converter as a central design element of the phase-locked loop, whereby the oscillator produces an output frequency proportional to its input voltage (in the case of a VCO) or current (in the case of a CCO).

A wide frequency range is needed for covering the wide frequency range clocking requirements of modern CPUs and system-on-chip (SOC) applications. A typical drawback of the oscillator is its uncertainty in output frequency to the applied input due to integrated circuit process variations. This leads to the need for an oscillator having a large gain (Kvco) to provide the desired frequencies. However, the large gain also has the effect of producing a large variation in the output frequency in response to any noise in the applied input voltage, also known as phase noise or jitter. This phase noise at the oscillator output is undesirable as it limits the purity of the output signal. A low Kvco is needed to minimize the noise transfer from the input (i.e., reference clock).

CCO-based PLLs have been proposed but also have very high Kvco (e.g., 10 GHz/V or more), which undesirably pass noise and also require a large loop filter capacitors, which has area penalties, or low charge-pump current for a PLL bandwidth range requirement. The low charge pump current makes the oscillator more sensitive to charge pump current mismatch from charge injection, displacement current, device leakage, etc.

Improved CCO-based PLL circuits are desired.

BRIEF DESCRIPTION OF THE DRAWINGS

The accompanying drawings illustrate embodiments of the invention, as well as other information pertinent to the disclosure, in which.

DETAILED DESCRIPTION

This description of the exemplary embodiments is intended to be read in connection with the accompanying drawings, which are to be considered part of the entire written description. In the description, terms concerning electrical coupling and the like, such as "coupled", "connected" and "interconnected," refer to a relationship wherein structures communicate with one another either directly or indirectly through intervening structures unless expressly described otherwise.

Figure 1:
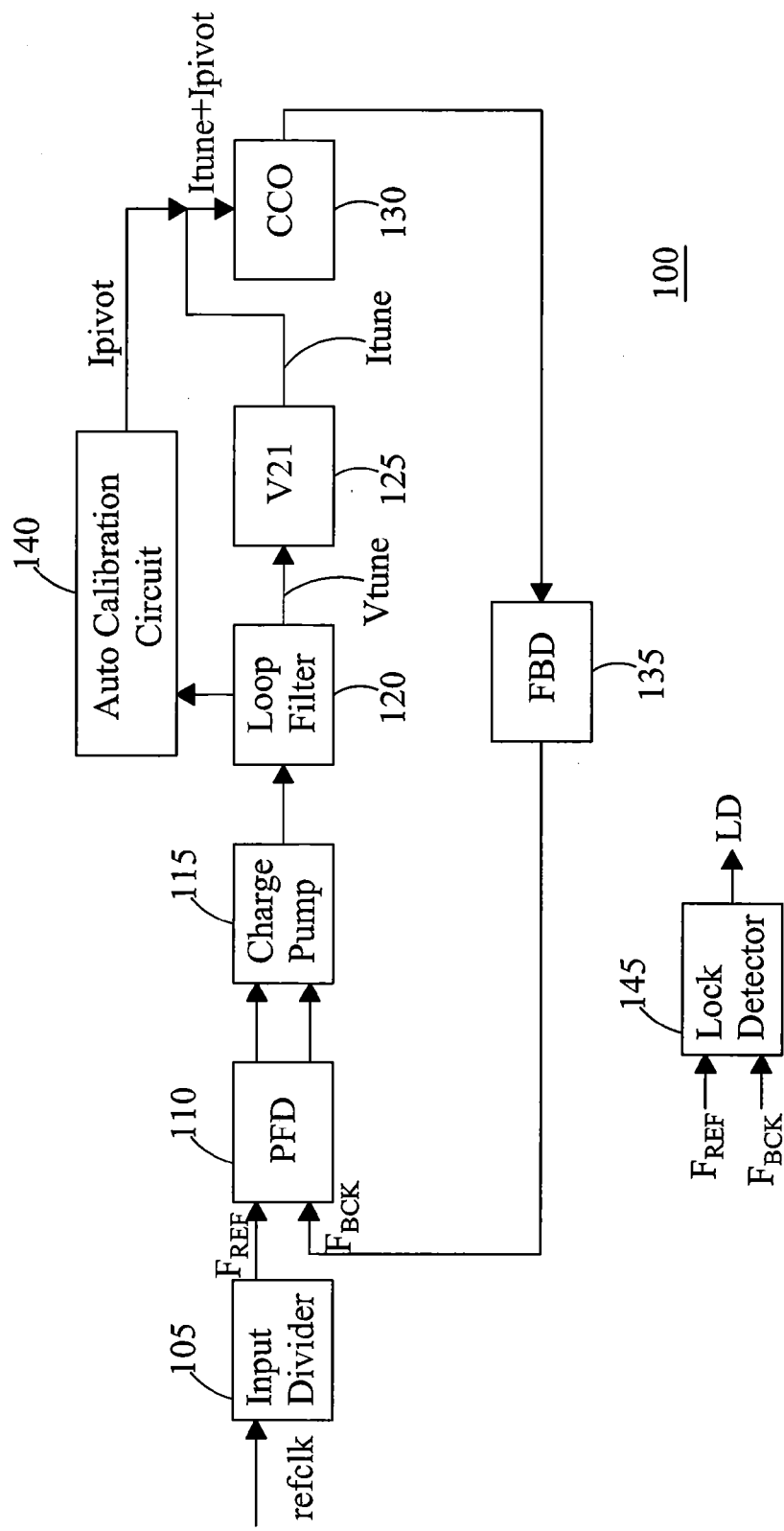
FIG. 1 is a diagram of an embodiment of a CCO-based PLL circuit having an analog auto calibration circuit.

FIG. 1 illustrates an embodiment of a CCO-based PLL circuit 100 employing analog coarse tuning calibration. The PLL circuit 100 includes an input frequency divider 105 coupled to a reference clock signal (refclk). The frequency divided output signal $F_{REF}$ from the input divider 105 is provided to a phase frequency detector 110. The phase frequency detector 110 also has an input coupled to a feedback signal $F_{BCK}$ (provided by a feedback divider 135. The outputs of the phase frequency detector 110 are provided to a programmable charge pump 115. The output of charge pump 115 is couple to a loop filter 120, which provides a fine tuning voltage Vtune to a voltage-to-current converter 125. Voltage-to-current converter 125 provide a fine tuning current Itune to a current-controlled oscillator (CCO) 130. The output of the CCO 130 is provided to the feedback divider 135. A lock detector 145 is also shown for determining if frequency lock has been reached. Thus far, the PLL circuit 100 is of a conventional design and uses conventional components familiar to those in the art of PLL design.

In the illustrated embodiment, the PLL circuit includes an analog auto calibration circuit 140 that provides a coarse tuning current labeled Ipivot for providing coarse adjustments to a frequency pivot point of the oscillator frequency of the CCO 130. The auto calibration circuit 140 is coupled to the loop filter 120. Pivot current Ipivot is added to tuning current Itune, and the combined current controls the CCO 130. The auto calibration circuit 140 is designed with a calibratable and automatically adjustable coarse-tune pivot point. The coarse tune is implemented by a coarse-tune voltage-to-current circuit (described in more detail in connection with FIG. 2) to adjust the pivot point for the CCO oscillation frequency.

Figure 2:
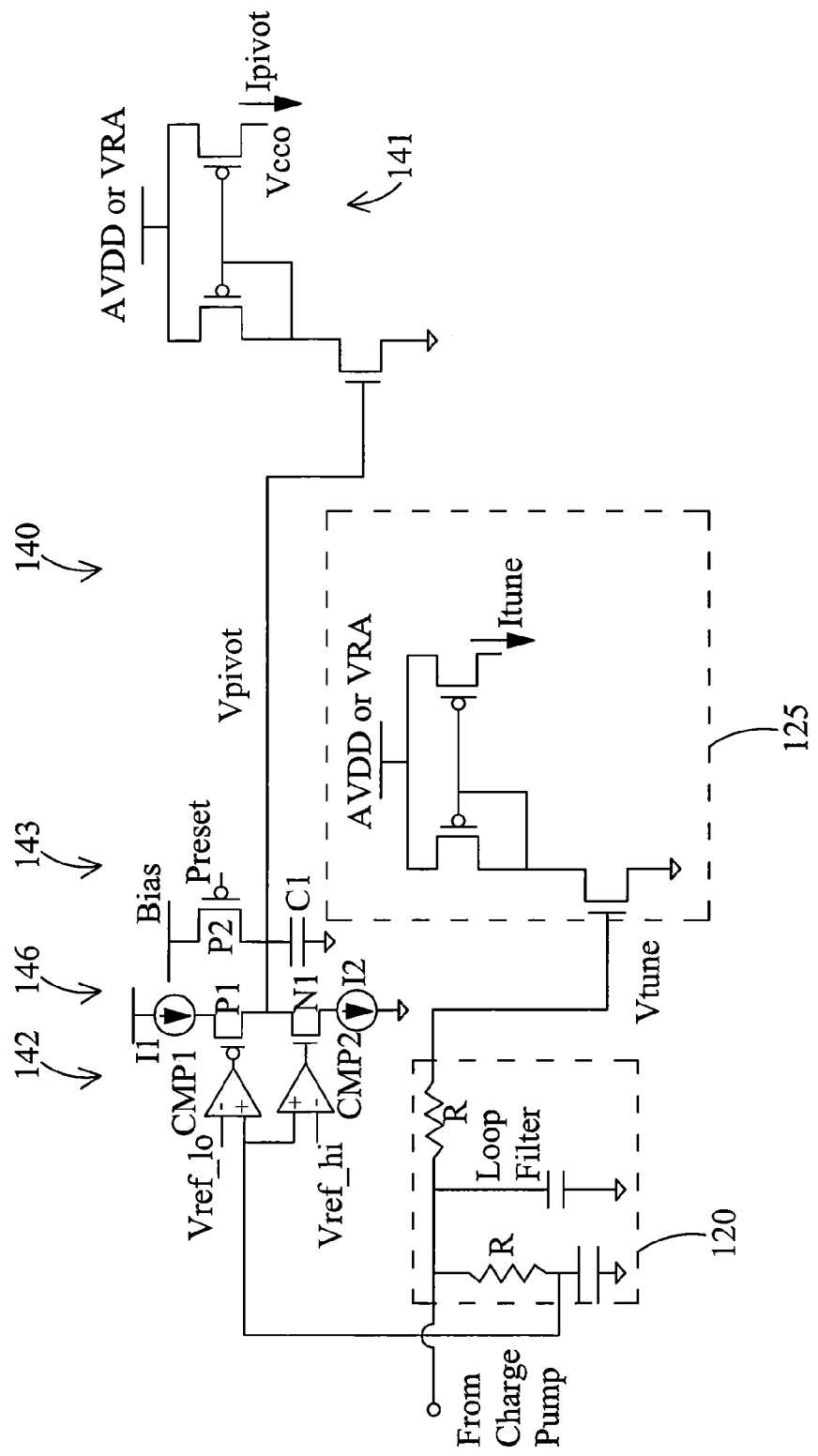
FIG. 2 is a circuit diagram illustrating the loop filter, loop voltage-to-current converter and analog auto calibration circuit of the FIG. 1.

FIG. 2 illustrates the auto calibration circuit 140 in more detail. Also illustrated in FIG. 2 in more detail are the loop filter 120 and voltage-to-current converter 125. The calibration circuit includes a second voltage-to-current converter 141 that provides the coarse tuning current Ipivot in response to coarse tuning voltage Vpivot. The voltage-to-current converters 125, 141 are coupled to an analog voltage supply (AVDD) or a voltage regulator supply for an analog circuit (VRA). The pivot voltage Vpivot is provided by a sensing circuit 142. The sensing circuit 142 includes a pair of comparators CMP1, CMP2, each having an input coupled to an internal node of the loop filter that has a voltage value corresponding to voltage Vtune but with much less ripple (than Vtune). The second input of the first comparator CMP1 is coupled to a low reference voltage Vref_lo, and the second input of the second comparator is coupled to a high reference voltage Vref_hi. The calibration circuit 140 also includes a charge pump circuit 146, which includes a stack of switching transistors including PMOS P1 and NMOS N1 connected in series with a pull-up current source I1 and pull-down current source I2. The output of comparator CMP1 is coupled to the gate terminal of transistor P1, and the output of comparator CMP2 is coupled to the gate terminal of transistor N1. The common drain terminal of the transistors N1, P1 is coupled to the input of the second voltage-to-current converter circuit 141 at a coarse tuning voltage node to provide voltage Vpivot.

The calibration circuit 140 also includes a pre-charge circuit 143 including PMOS transistor P2, which has a source terminal coupled to a supply node, a gate terminal coupled to a preset voltage (Preset) and a drain terminal coupled to the Vpivot node. A capacitor C1 is also coupled to the Vpivot node.

Transistor P2 and capacitor C1 cooperate to pre-charge the coarse-tune voltage (i.e., Vpivot) to a voltage to enable the CCO to oscillate at a predetermined initial CCO frequency for the PLL to lock. Specifically, at start up, voltage Preset goes low, which turns on PMOS P2 to charge capacitor C1 such that node Vpivot takes on an initial value. Preset then goes high, turning off PMOS P2. At this time, when the initial value of Vpivot is set, second voltage-to-current converter 141 provides coarse tuning current Ipivot based on voltage Vpivot. The initial frequency of the CCO 130 is set by the combined current Itune+Ipivot.

Thereafter, the PLL operates in a conventional manner to modify fine tuning voltage Vtune (and thus Itune as well), in response to the output of charge pump 115.

The calibration circuit 140 operates as follows. When the frequency of the CCO output is below the PLL target frequency and Vtune is below Vref_lo, then the circuit operates to add current to the CCO via pivot current Ipivot. Specifically, in this situation the voltage input from the loop filter to comparators CMP1 and CMP2 will be below both Vref_lo and Vref_hi. The output of both comparators is a logical "0", which turns on PMOS P1 and turns off NMOS N1. With PMOS P1 on, pull-up current source I1 is coupled to the coarse tuning voltage node, which charges the capacitor C1 and increases voltage Vpivot, which in turn increases pivot current Ipivot. Basically, this operation moves the pivot point of the CCO.

Conversely, when the frequency of the CCO is too high (i.e., higher than the PLL target frequency) and Vtune is above Vref_hi, then the calibration circuit 140 operates to lower the current to the CCO via pivot current Ipivot. Specifically, when the voltage from the loop filter 120 provided to the comparators is higher than Vref_hi, both comparators output a logical "1", which turns off PMOS P1 and turns on NMOS N1. NMOS N1 connects pull-down current source I2 to the capacitor, which discharges the capacitor C1 and reduces the voltage Vpivot. This, in turn, reduces the pivot current Ipivot.

When the frequency of the PLL is at or around the target frequency (i.e., within a range where only adjustments to fine tuning voltage Vtune need to be made), the voltage from the loop filter will fall between Vref_lo and Vref_hi. In this case, comparator CMP1 outputs a logical "1" and comparator CMP2 outputs a logical "0". Both transistors P1 and N1 are off, and the pivot point remains as set by the current value of the voltage provided by the charge on capacitor C1.

As described above, the auto-calibration circuit 140 senses a voltage corresponding to the CCO fine-tune voltage and compares it with a predetermined pair of voltage thresholds. Kvco remains relatively constant between this pair of the voltage thresholds. The auto-calibration circuit then charges or discharges the coarse-tune voltage node to increase or decrease the frequency pivot point if the fine-tune voltage falls outside of the range defined by the predetermined pair of voltage thresholds. That is, the auto-calibration circuit moves the pivot point when the fine-tune voltage cannot bring the PLL circuit to lock. The fine-tune Kvco is relatively constant but may still have some slope while flattening out near high and low values of fine-tune voltage (Vtune). In embodiments, the Vref_lo and Vref_hi values can be selected to be close to the inflection points of the fine-tune Kvco.

Figure 3:
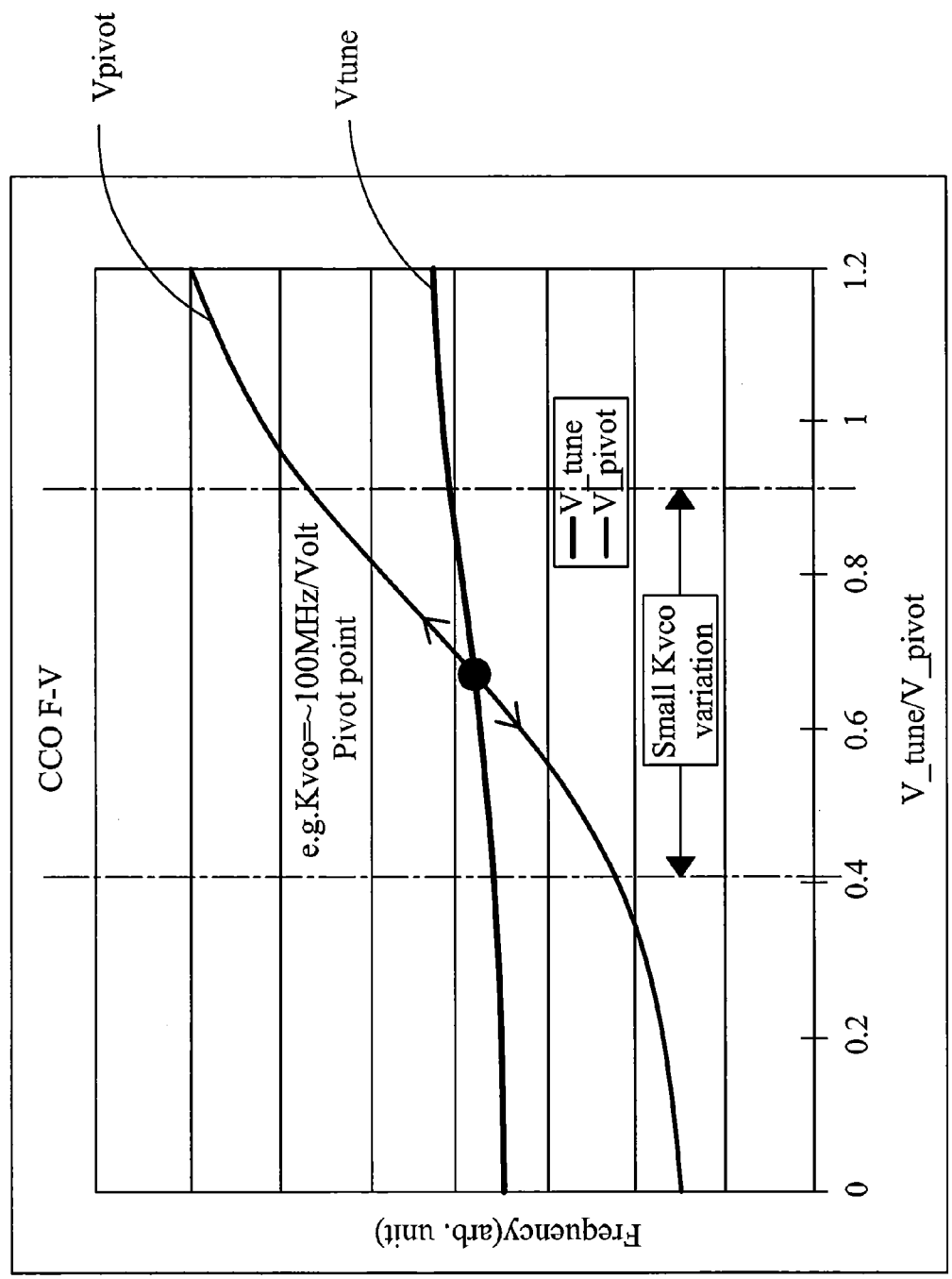
FIG. 3 is a graph of frequency versus voltage for the PLL circuit of FIG. 1.

FIG. 3 is a graph of frequency versus the fine tuning voltage Vtune and the coarse tuning voltage Vpivot for the PLL circuit 100 of FIG. 1 from an exemplary simulation thereof. As can be seen from the graph, the pivot point can be moved continuously (i.e., not in discrete increments) up or down, and the initial pivot point is set by the pre-charge circuit. An advantage of the PLL circuit having analog auto calibration circuit 140 is that it provides a continuous range of pivot points, across a wide frequency range, enabling the fine-tune Kvco to have little variation. Having a continuous range of pivot points available means that there are no frequency dead zones, in which the PLL will fail to lock. The low Kvco across the range reduces noise pass through.

Figure 4:
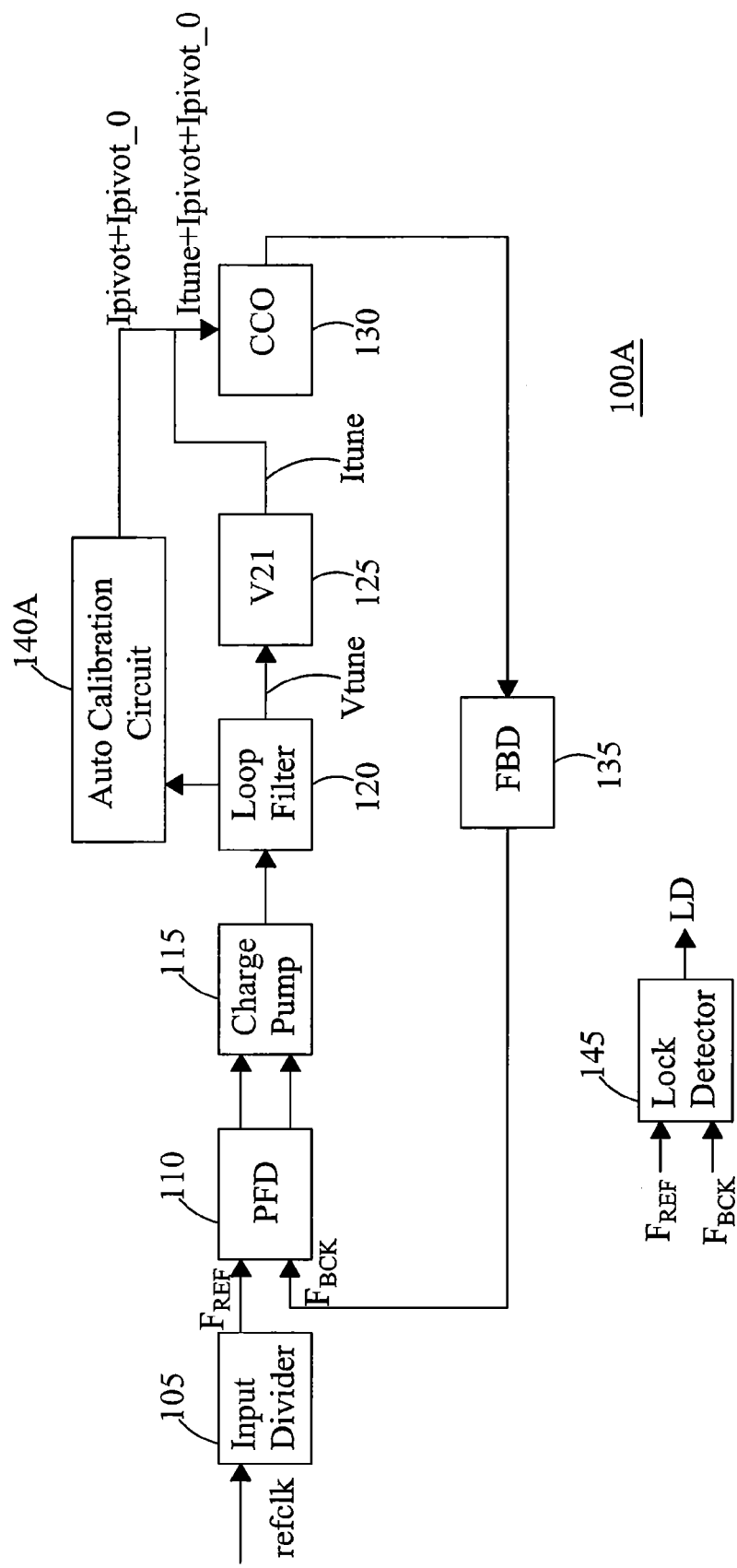
FIG. 4 is a diagram of an alternative embodiment of a CCO-based PLL circuit having an analog auto calibration circuit.

FIG. 4 illustrates an alternative embodiment of a CCO-based PLL circuit 100A employing analog coarse tuning calibration. The PLL circuit 100A is identical to the PLL circuit 100 except for a slight modification to auto calibration circuit 140A. Specifically, as illustrated in more detail in connection with FIG. 5, the auto calibration circuit 140A provides both the pivot current Ipivot and a start-up pivot current Ipivot_0.

Figure 5:
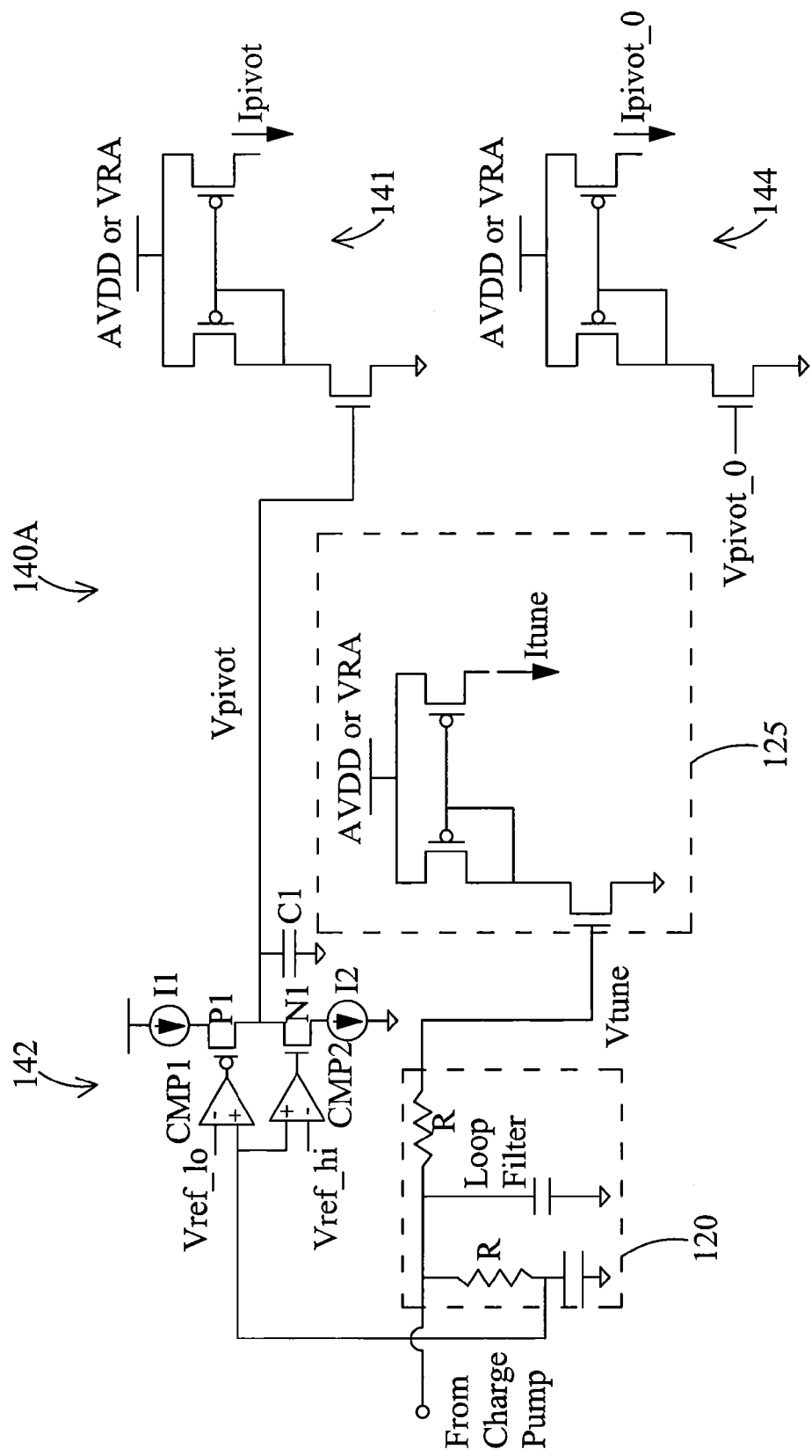
FIG. 5 is a circuit diagram illustrating the loop filter, loop voltage-to-current converter and analog auto calibration circuit of the FIG. 4.

FIG. 5 illustrates that the calibration circuit 140A is identical to the calibration circuit 140 except that there is no pre-charge circuit 143 (i.e., PMOS P2 has been removed) and third voltage-to-current converter circuit 144 has been added. In this embodiment, the initial CCO frequency is set by a fixed CCO current Ipivot_0. The third voltage-to-current converter circuit 144 provides a fixed start-up pivot current Ipivot_0 from start-up pivot voltage Vpivot_0. Because there is no pre-charge circuit, the capacitor C1 has no initial charge stored therein. So, at start-up, voltage Vpivot equals zero volts, pivot current Ipivot is zero amps. However, at start-up Vpivot is a predetermined positive voltage, which makes I_pivot a predetermined positive current. Ipivot_0 is set the initial pivot point. This pivot point should be set so that the initial start-up frequency of the CCO is lower than the target frequency since at start-up the capacitor is not charged and thus Vpivot can only increase as the capacitor is charged. If the initial frequency were set too high, the calibration circuit would not be able to lower the frequency.

Figure 6:
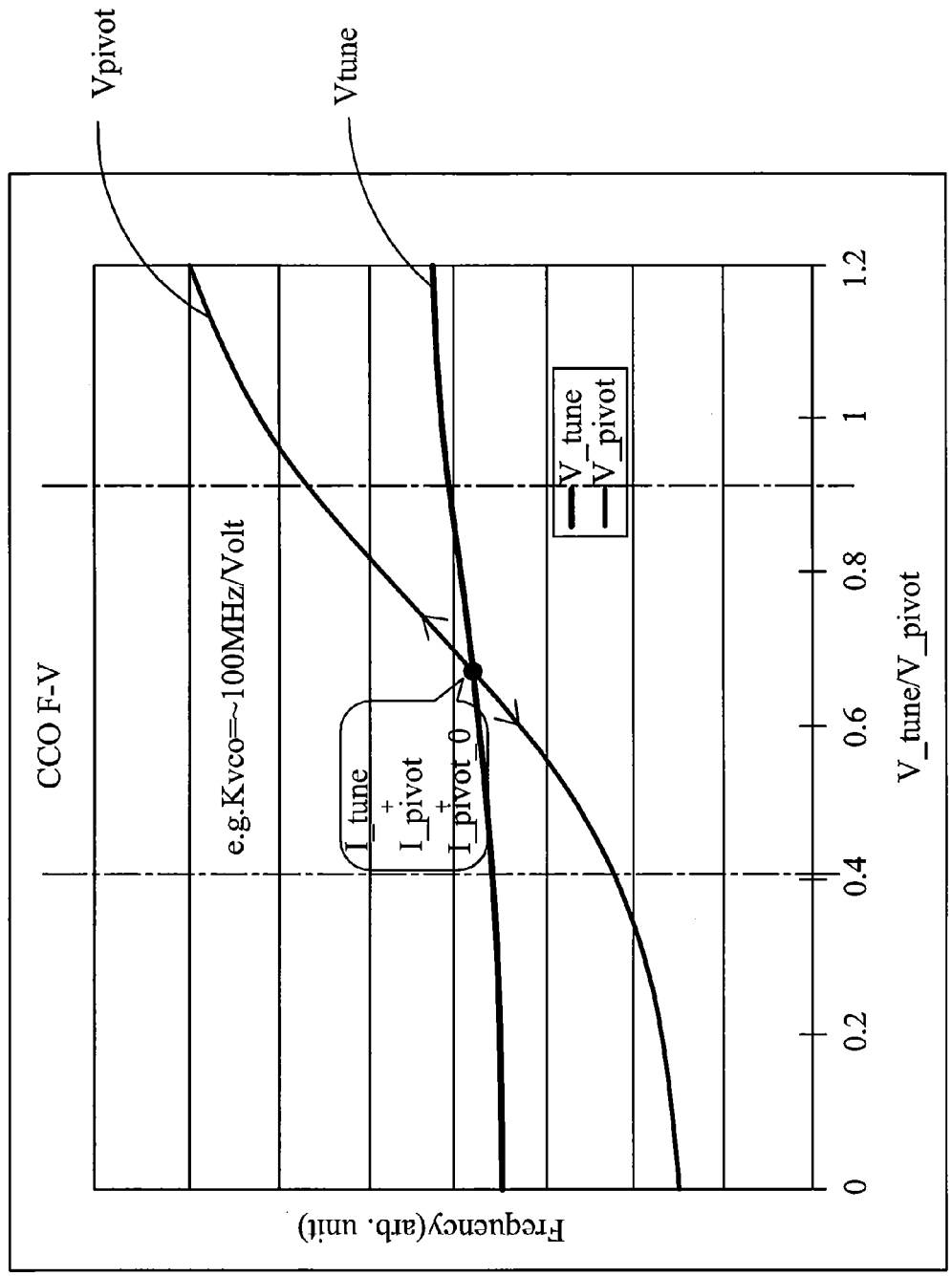
FIG. 6 is a graph of frequency versus voltage for the PLL circuit of FIG. 4.

Like FIG. 3, FIG. 6 is a graph of frequency versus the fine tuning voltage Vtune and the coarse tuning voltage Vpivot for the PLL circuit 100A of FIG. 4 from an exemplary simulation thereof. As can be seen from the graph, the pivot point can be moved continuously up or down, and the initial pivot point is set by Ipivot_0. An advantage of the PLL circuit having auto calibration circuit 140A is that it provides a continuous range of pivot points, across a wide frequency range, enabling the fine-tune Kvco to have little variation. Having a continuous range of pivot points available means that there are no frequency dead zones, in which the PLL will fail to lock.

The embodiment of FIGS. 7-9 discussed below employs a digital control loop to automatically adjust the calibration bits to enable the CCO to oscillate at a desired frequency for the PLL to lock.

Figure 7:
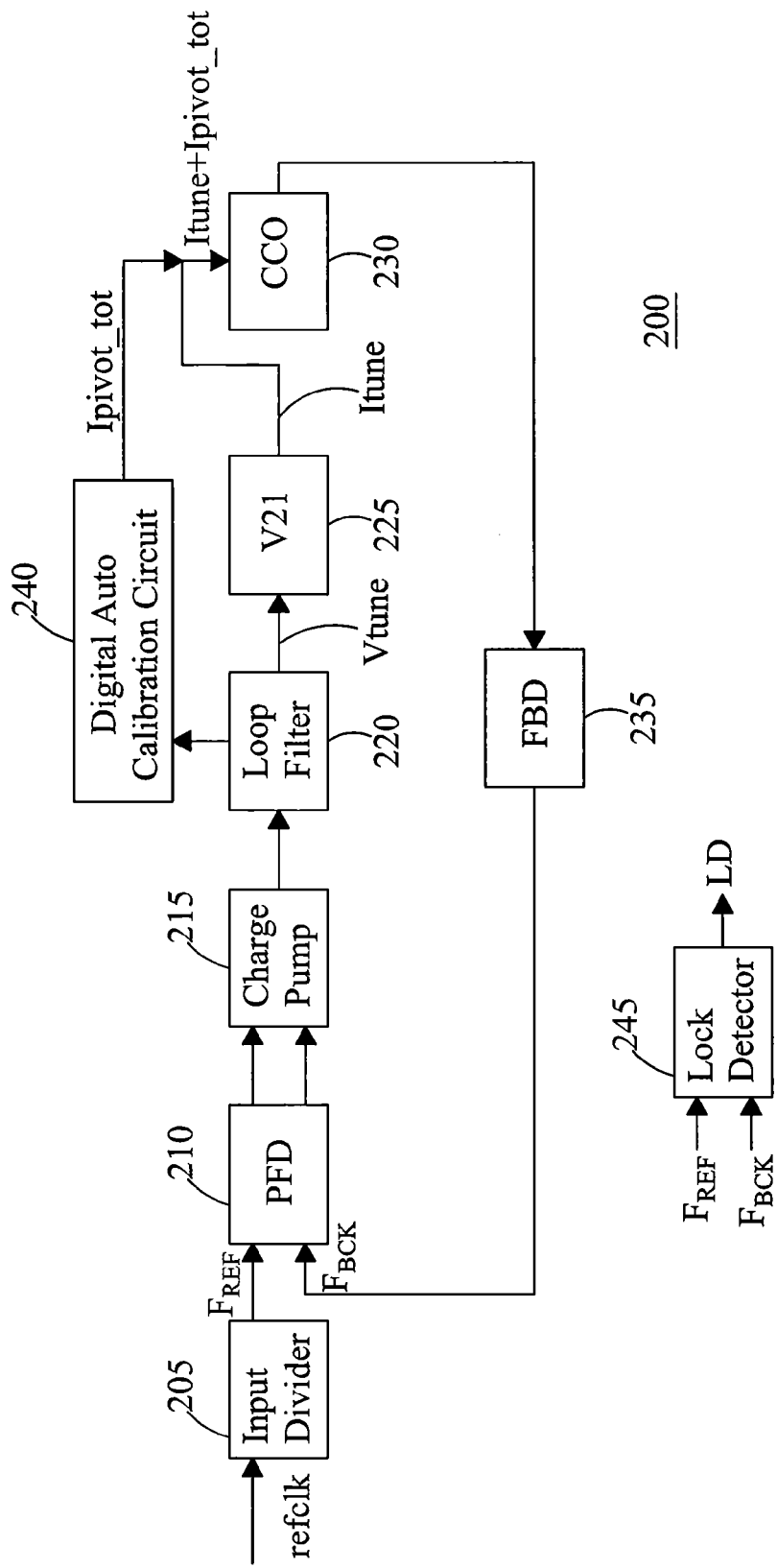
FIG. 7 is a diagram of an embodiment of a CCO-based PLL circuit having a digital auto calibration circuit.

Specifically, FIG. 7 illustrates an alternative embodiment of a CCO-based PLL circuit 200 employing digital coarse tuning calibration. The PLL circuit 200 is identical to the PLL circuit 100 except for the use of a digital auto calibration circuit 240. Like components from FIG. 1 are labeled with the same reference numbers but increased by 100, e.g., the feedback divider 235 is identical to the feedback divider 135. As described in more detail in connection with FIGS. 8A, 8B and 9, the digital auto calibration circuit 240 provides a pivot current labeled Ipivot_tot, which is added to the tuning current Itune. Current Ipivot_tot is the total of "n" number of pivot currents Ipivot. Unlike some traditional CCO-based PLLs, the PLL does not rely on manual trial-and-error control during production or silicon testing to adjust the calibration bits for setting the correct pivot current for the CCO-based PLL to lock. The use of auto-calibration reduces labor as well as testing and production costs.

Figure 8A:
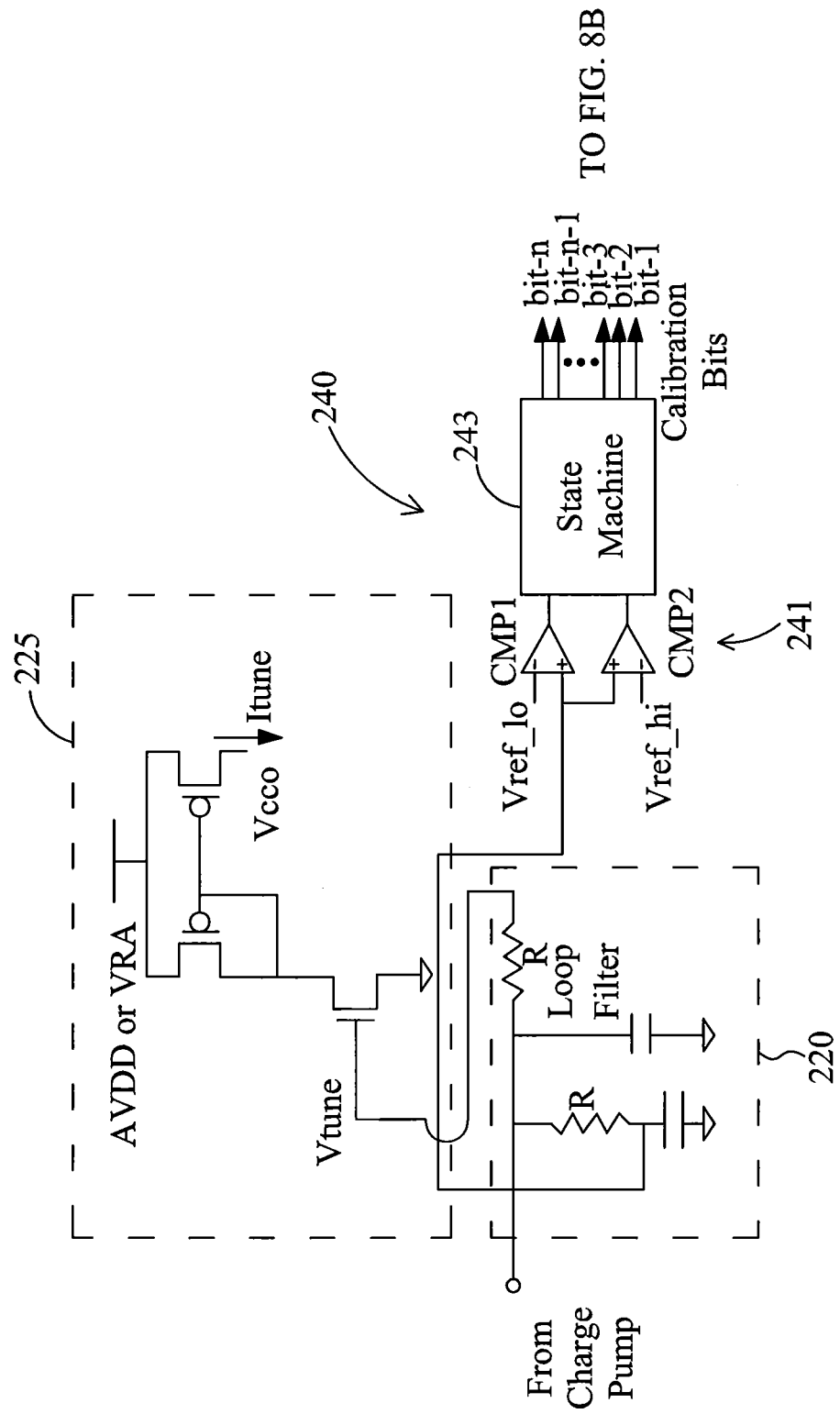
FIG. 8A is a circuit diagram illustrating the loop filter, loop voltage-to-current converter and digital auto calibration circuit of the FIG. 7.

Referring to FIG. 8A, the auto-calibration circuit 240 employs a sensing circuit 241 coupled to the loop filter 220 and a state machine 243 to adjust the calibration bits in response to the sensing circuit outputs so as to increase or decrease the coarse-tune pivot (current) point if the fine-tune voltage (Vtune) falls outside of a pair of predetermined voltage thresholds. As with the embodiments illustrated in FIGS. 2 and 5, the sensing circuit 241 includes comparators CMP1 and CMP2 coupled to reference voltage Vref_lo and Vref_hi, respectively, and to the loop filter 220. The gain Kvco remains relatively constant between the pair of the voltage thresholds.

Figure 8B:
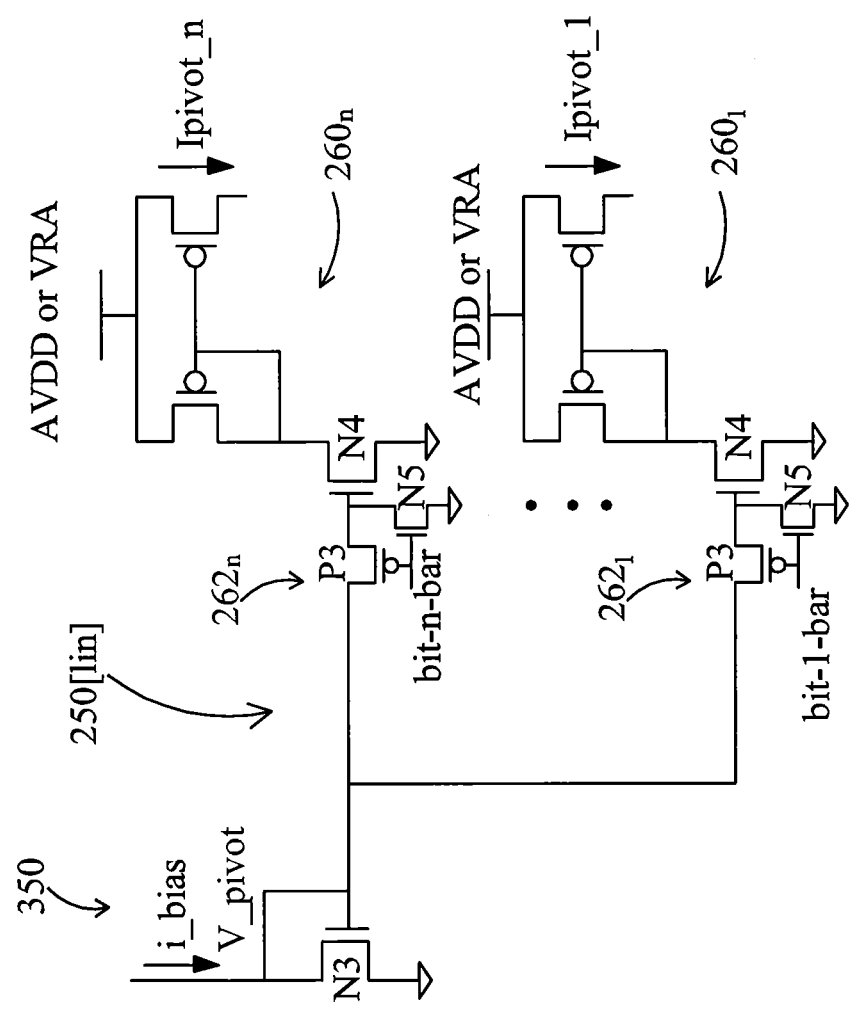
FIG. 8B is a continuation of FIG. 8 illustrating additional features of the digital auto calibration circuit.

FIG. 8B is a continuation of FIG. 8A and illustrates the use of the calibration bits bit_1 to bit_n in preparing the pivot current Ipivot_tot. The circuit includes an NMOS transistor N3 coupled to a constant current source that provides respective current mirrors 250[1:n] with NMOS transistors N4. The circuit includes "n" number of voltage-to-current converters 260 and corresponding "n" number of switch circuits 262. Each switch circuit includes a PMOS transistor P5 coupled between the Vpivot node (i.e., the first half of the current mirror 250) and each NMOS transistor N4 (i.e., the second half of the current mirror 250) and an NMOS transistor N5 coupled between the gate of NMOS N4 and ground. The gates of PMOS P3 and NMOS N5 are controlled by the logical inversion of a respective calibration bit, i.e., by a respective bit_[1:n]_bar. By way of example, when calibration bit "n" is logical low, then bit_n_bar is logical high. The PMOS transistor P3 is off, disconnecting the halves of the current mirror 250[n]. NMOS N5 is on, connecting the gate of N4 to ground, which turns N4 off. In turn, current Ipivot_n is zero and does not contribute to Ipivot_tot, which is the sum of all Ipivot currents Ipivot_1 to Ipivot_n. When calibration bit "n" is logical high, then bit_n_bar is logical low. The PMOS transistor P3 is on, connecting the halves of the current mirror 250[n] and the gate of NMOS N4 to Vpivot. NMOS N5 is off.

Figure 9:
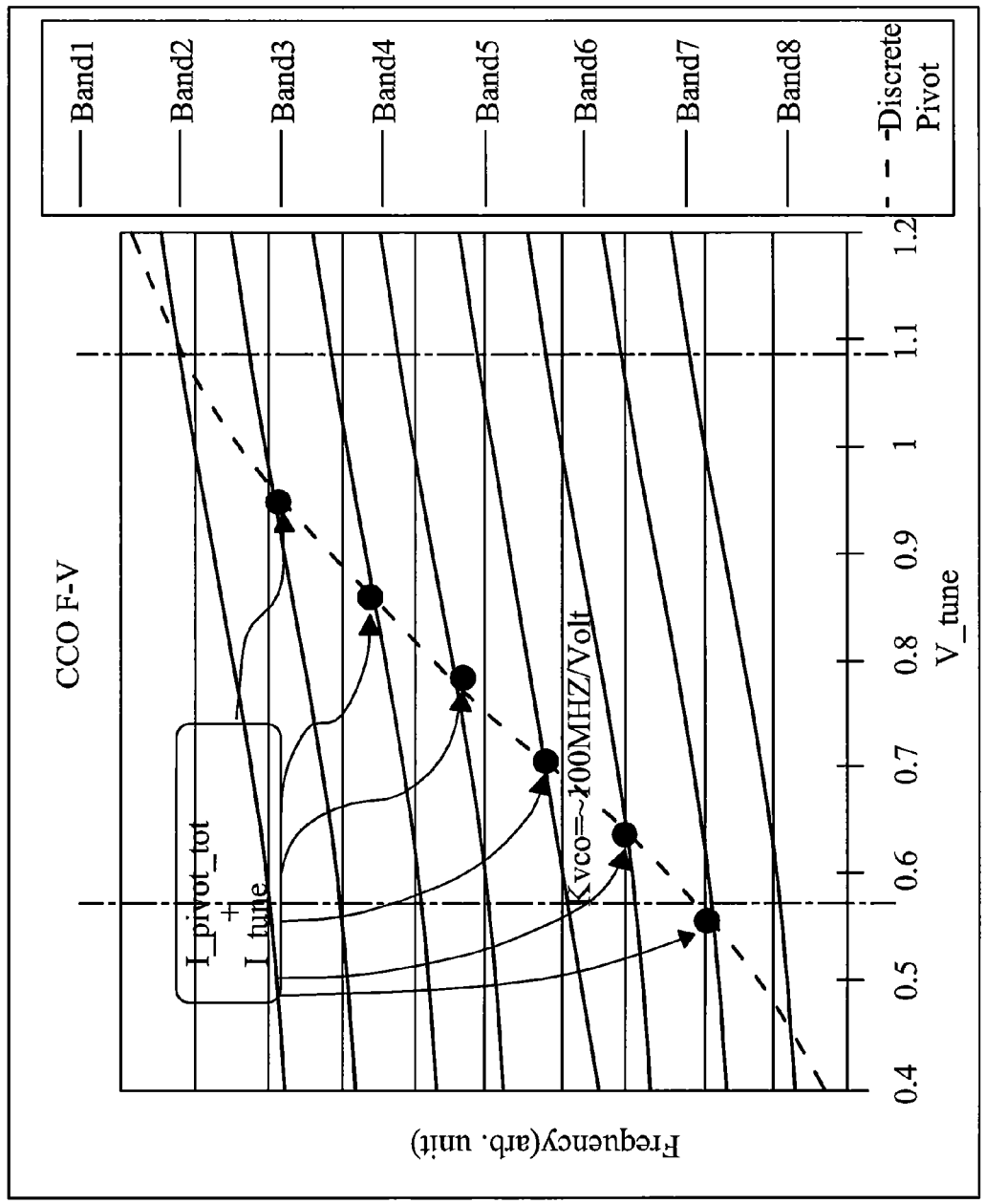
FIG. 9 is a graph of frequency versus voltage for the PLL circuit of FIG. 7.

FIG. 9 is a graph of frequency versus the fine tuning voltage Vtune for the PLL circuit 200 of FIG. 7 from an exemplary simulation thereof. Unlike the previous embodiments, as can be seen from the graph, the pivot point is not continuously adjustable along a smooth curve but rather is moved in discrete increments up or down. As is illustrated in this graph, this embodiment provides a wide frequency range in the form of multiple frequency bands where the gain (Kvco) remains relatively constant between the pair of the voltage thresholds within the individual bands.

Figure 10:
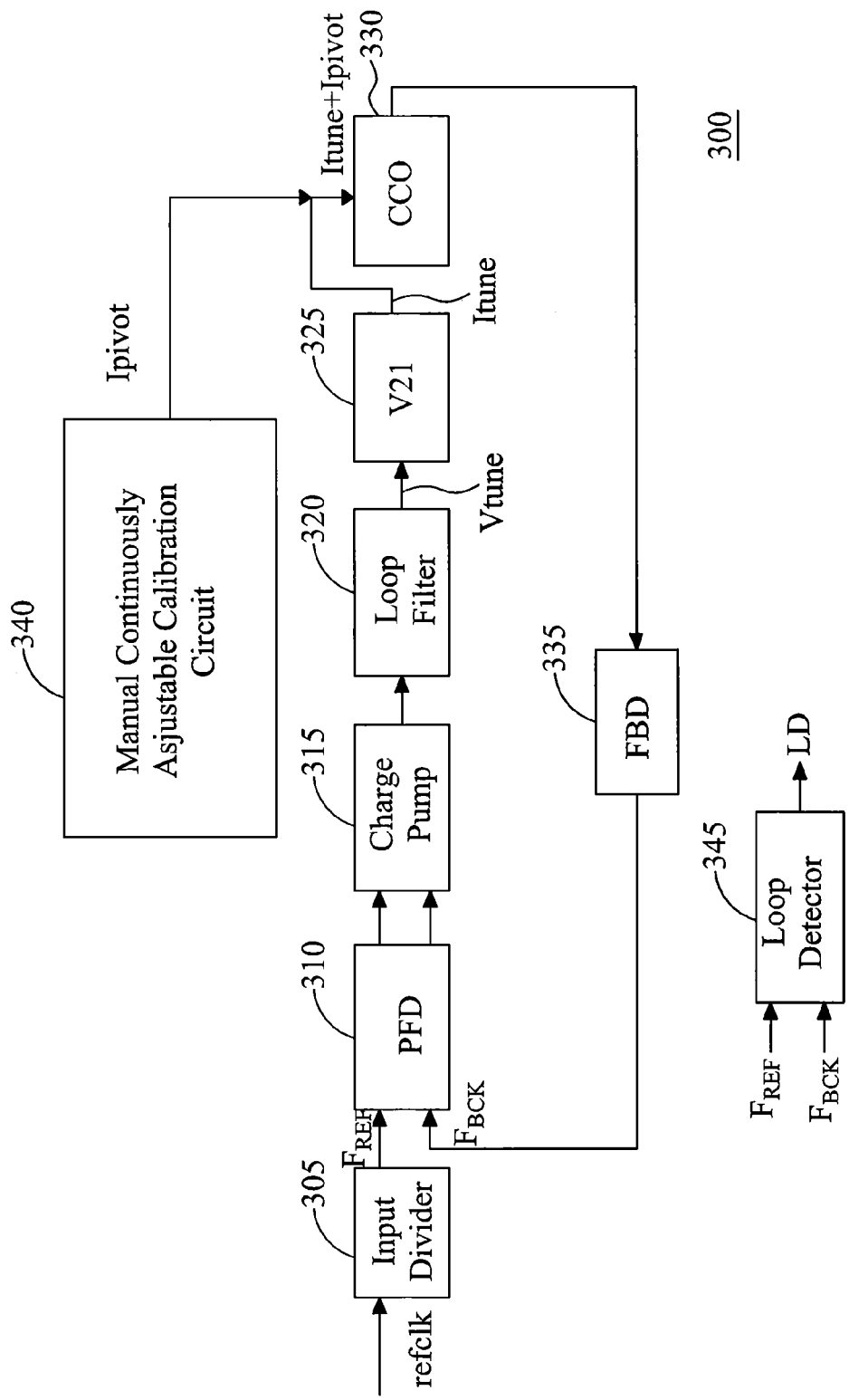
FIG. 10 is a diagram of an embodiment of a CCO-based PLL circuit having a manual continuously adjustable analog calibration circuit.

FIG. 10 illustrates another embodiment of a CCO-based PLL circuit 300. The PLL circuit 300 is identical to the PLL circuit 100 except for the use of a manually and continuously adjustable calibration circuit 340 for providing the pivot current Ipivot. Like components from FIG. 10 are labeled with the same reference numbers but increased by 200, e.g., the feedback divider 335 is identical to the feedback divider 135, the first voltage-to-current converter 325 is identical to voltage-to-current converter 125, etc.

Figures 11A, 11B:
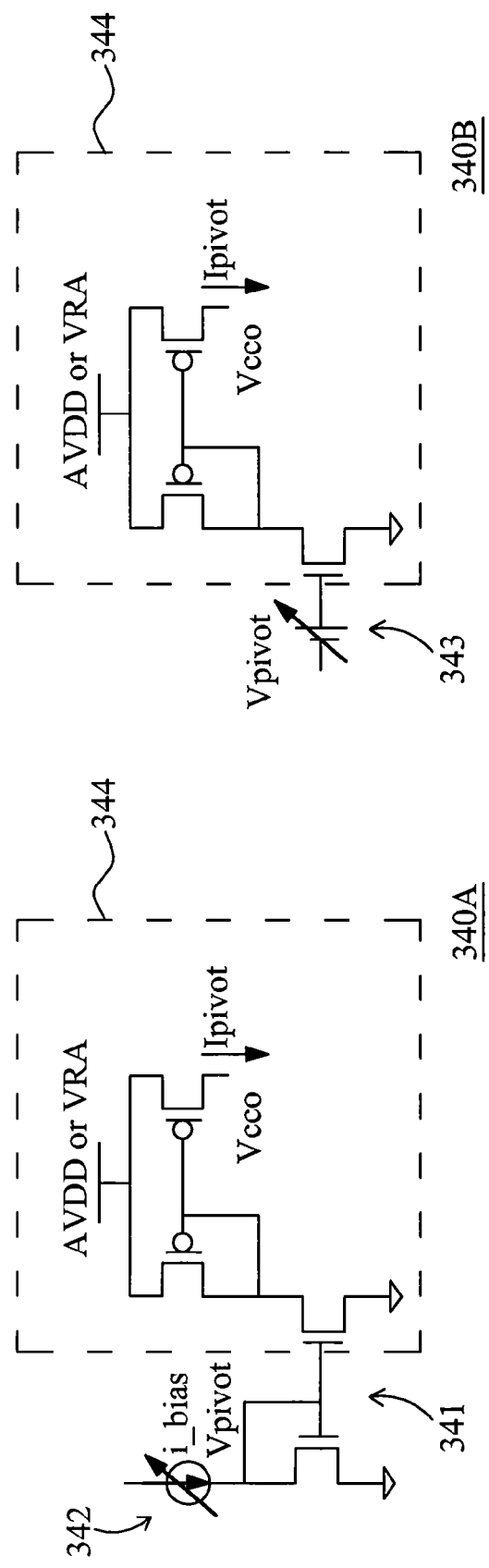
FIGS. 11A and 11B are circuit diagrams illustrating embodiments of the manual continuously adjustable analog calibration circuit of the FIG. 1.

FIGS. 11A and 11B illustrate embodiments of the manual continuously adjustable calibration circuit 340A, 340B, respectively. Each embodiment includes a voltage-to-current converter 344. Calibration circuit 340A uses a current mirror 341 and manually variable current source 342, such as an external variable current source or an external voltage source in series with a variable resistor, to provide a continuously variable pivot voltage Vpivot as input to the voltage-to-current converter 344. Calibration circuit 340B use a variable voltage source 343, such as an external variable voltage source, to provide a continuously variable pivot voltage Vpivot as input to the voltage-to-current converter 344. In turn, pivot current Ipivot is continuously adjustable across a range of values.

Figure 12:
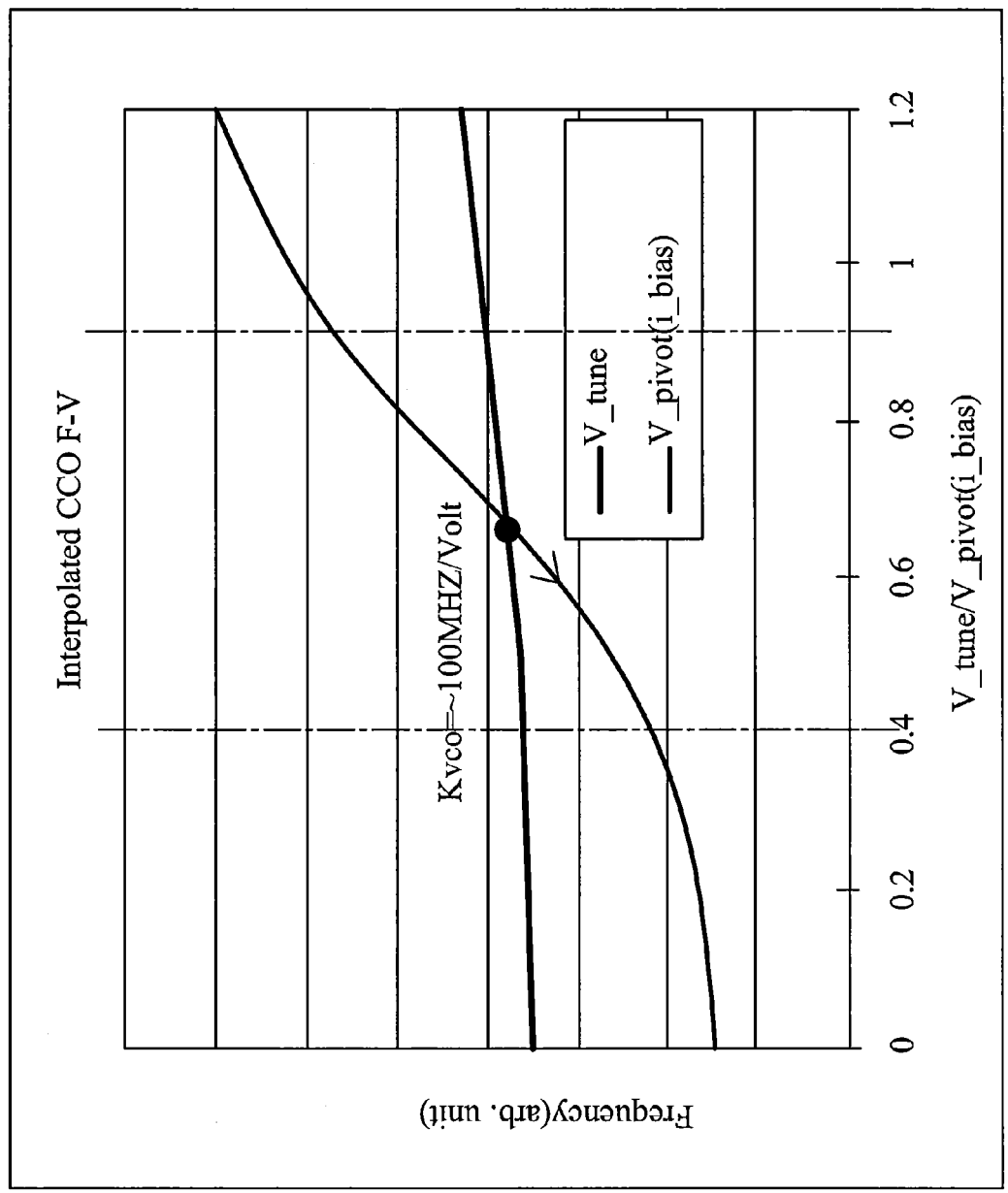
FIG. 12 is a graph of frequency versus voltage for the PLL circuit of FIG. 10.

Like FIGS. 3 and 6, FIG. 12 is a graph of frequency versus the fine tuning voltage Vtune and the coarse tuning voltage Vpivot for the PLL circuit 300 of FIG. 10 from an exemplary simulation thereof. As can be seen from the graph, the pivot point can be moved continuously up or down. The initial pivot point is set by a predetermined initial current source value from current source 342 or a predetermined initial voltage value from voltage source 343 such that the initial CCO frequency is close to the PLL locking frequency. As is illustrated in this graph, an advantage of the PLL circuit is that it provides a continuous range of pivot points, across a wide frequency range, with a large Kvco, but with small Kvco. Having a continuous range of pivot points available means that there are no frequency dead zones, in which the PLL will fail to lock.

It can be difficult to get the correct pivot current setting for getting the PLL to lock setting using CCO-based PLLs with discrete (i.e., incremental) manual calibration controls. As pointed earlier, the Kvco and frequency coverage range may vary significantly with process variations such that each adjacent frequency band is not able to overlap with each other using the discrete settings. The PLL will then fail to lock due to these frequency dead zones. The use of finer steps may mitigate this issue but requires greater number of calibration bits and thus has hardware penalties as well as higher testing/production costs. The embodiment of FIG. 10 employs an analog control to manually change the pivot current using a continuously adjustable external current or voltage bias, which eliminates dead frequency zones. This approach is well suited to circuit evaluation and low volume products.

Figure 13:
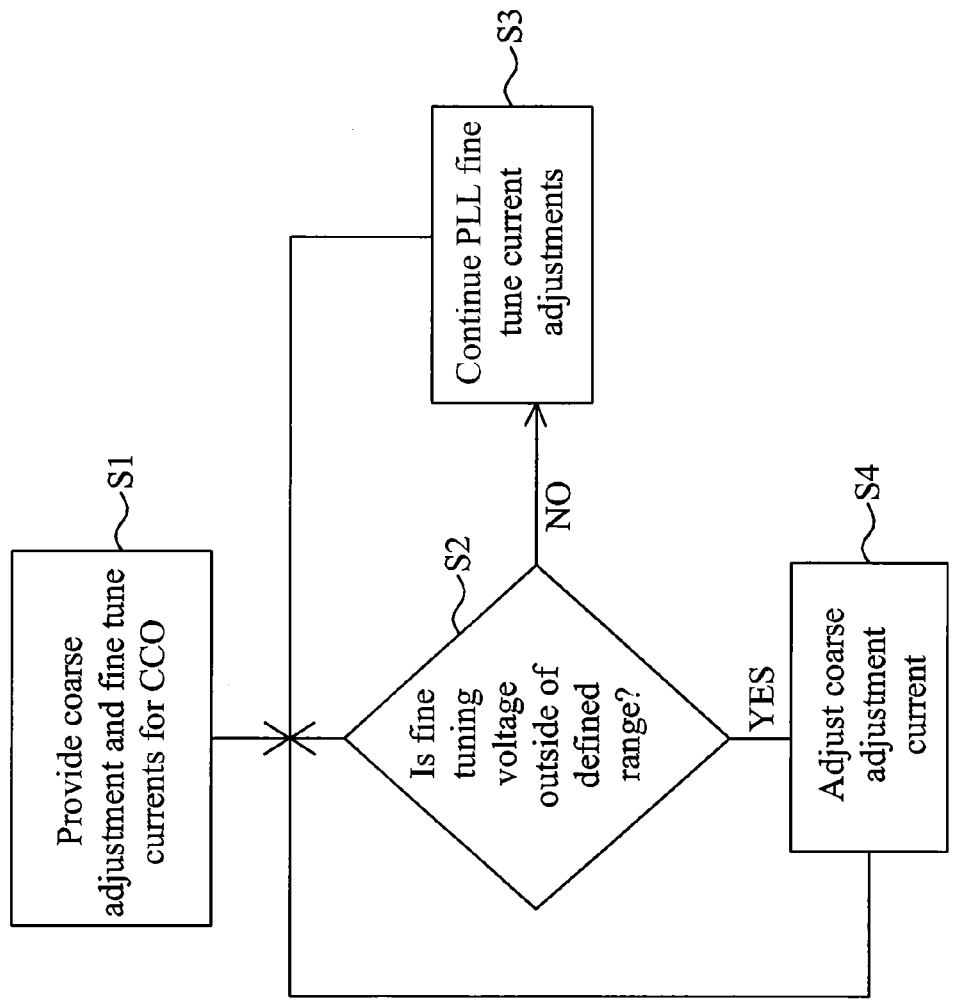
FIG. 13 illustrates an automated method of bringing a CCO-based PLL to lock.

FIG. 13 illustrates an automated method of bringing a CCO-based PLL to lock, where the CCO generates a frequency signal at an output responsive to a fine tuning current corresponding to a fine tuning voltage from a loop filter. The method can be performed by, for example, the calibration circuit of FIG. 1, 4 or 7. At step S1, a coarse adjustment current is provided for coarse adjustments to a frequency pivot point for an oscillation frequency of the CCO, and the PLL provides a fine tune current for the CCO. At step S2, a sensing circuit senses if the fine tuning voltage is outside of a range defined between a pair of predetermined reference voltages. At step S4, if the fine tuning voltage is outside of the range, the coarse adjustment current is adjusted to move the frequency pivot point to bring the fine tuning voltage within the range. At step S3, if the fine tuning voltage is within the range, the PLL fine-tune loop is allowed to work towards providing lock. The steps are repeated to keep the fine tuning voltage within the predefined range until lock is achieved.

As described herein, various embodiments of a CCO-based PLL circuit provide a small gain (Kvco) yet wide-frequency-range. The flatter Kvco provides significantly better PLL jitter performance. Embodiments that employ continuously tunable pivot points are also able to prevent calibration loop failure due to process (and/or supply voltage) variations. Embodiments with automatic calibration provide significant production/testing costs savings.

In one embodiment of a phase-locked loop (PLL) circuit, the PLL circuit includes a phase frequency detector; a programmable charge pump coupled to an output of the phase frequency detector; a loop filter coupled to an output of the charge pump, the loop filter providing a fine tuning voltage; a first voltage-to-current converter, the first voltage-to-current converter providing a fine tuning current corresponding to the fine tuning voltage; a current-controlled oscillator (CCO); a feedback divider coupled to an output of the CCO and an input of the phase frequency detector; and an analog calibration circuit. The analog calibration circuit provides a coarse adjustment current for coarse adjustments to a frequency pivot point for an oscillator frequency of the CCO, wherein the CCO generates a frequency signal at an output responsive to the coarse adjustment and fine tuning currents, wherein the frequency pivot point is continuously adjustable.

In another embodiment the PLL circuit includes a phase frequency detector; a programmable charge pump coupled to an output of the phase frequency detector; a loop filter coupled to an output of the charge pump, the loop filter providing a fine tuning voltage; a first voltage-to-current converter, the first voltage-to-current converter providing a fine tuning current corresponding to the fine tuning voltage; a current-controlled oscillator (CCO); a feedback divider coupled to an output of the CCO and an input of the phase frequency detector; and an digital calibration circuit. The digital calibration circuit automatically provides a coarse adjustment current for coarse adjustments to a frequency pivot point for an oscillator frequency of the CCO, wherein the CCO generates a frequency signal at an output responsive to the coarse adjustment and fine tuning currents, wherein the frequency pivot point is incrementally adjustable.

In an embodiment of a method of bringing a CCO-based PLL to lock, where the CCO generates a frequency signal at an output responsive to a fine tuning current corresponding to a fine tuning voltage from a loop filter, the method includes the steps of: providing a coarse adjustment current for coarse adjustments to a frequency pivot point for an oscillation frequency of the CCO; sensing with a sensing circuit if the fine tuning voltage is outside of a range defined between a pair of predetermined reference voltages; and if the fine tuning voltage is outside of the range, adjusting the coarse adjustment current to move the frequency pivot point to bring the fine tuning voltage within the range.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A phase-locked loop (PLL) circuit, comprising:
a phase frequency detector;
a programmable charge pump coupled to an output of the phase frequency detector;
a loop filter coupled to an output of the charge pump, said loop filter providing a fine tuning voltage;
a first voltage-to-current converter, the first voltage-to-current converter providing a fine tuning current corresponding to the fine tuning voltage;
a current-controlled oscillator (CCO);
a feedback divider coupled to an output of the CCO and an input of the phase frequency detector; and
an analog calibration circuit for providing a coarse adjustment current for coarse adjustments to a frequency pivot point for an oscillator frequency of the CCO, wherein the CCO generates a frequency signal at an output responsive to the coarse adjustment and fine tuning currents, wherein the frequency pivot point is continuously adjustable.

2. The PLL circuit of claim 1, wherein the analog calibration circuit is configured to automatically adjust the frequency pivot point responsive to the fine tuning voltage being outside of a range defined between a pair of predetermined reference voltages.

3. The PLL circuit of claim 2, wherein a first one of the predetermined reference voltages is a low reference voltage and a second one of the predetermined reference voltages is a high reference voltage, wherein the analog calibration circuit comprises:
a second voltage-to-current converter having an input coupled to a coarse adjustment voltage node for receiving a coarse adjustment voltage and an output for providing the coarse adjustment current;
a sensing circuit for sensing if the fine tuning voltage is above the high reference voltage or below the low reference voltage;
a capacitor coupled to the coarse adjustment voltage node; and
a charge-pump circuit responsive to the sensing circuit for charging the capacitor to increase the coarse adjustment voltage if the fine tuning voltage is below the low reference voltage and discharging the capacitor to decrease the coarse adjustment voltage if the fine tuning voltage is above the high reference voltage.

4. The PLL circuit of claim 3, wherein the sensing circuit comprises a first comparator having an input coupled to the low reference voltage and a second comparator having an input coupled to the high reference voltage.

5. The PLL circuit of claim 4, wherein the charge-pump circuit comprises a pull-up current source, a PMOS transistor coupled to an output of the first comparator and between the coarse adjustment voltage node and the pull-up current source, a pull-down current source, and a NMOS transistor coupled to an output of the second comparator and between the coarse adjustment voltage node and the pull-down current source.

6. The PLL circuit of claim 3, further comprising a pre-charge circuit for precharging the coarse adjustment voltage node to set a predetermined initial oscillation frequency of the CCO.

7. The PLL circuit of claim 6, wherein the pre-charge circuit is responsive to a control signal to turn off after an initial start-up phase.

8. The PLL circuit of claim 3, wherein the analog calibration circuit includes a current source for providing a startup current for setting a predetermined initial oscillation frequency of the CCO.

9. The PLL circuit of claim 8, wherein the current source comprises a third voltage-to-current converter for providing the startup current responsive to a predetermined input voltage.

10. The PLL circuit of claim 1, wherein the coarse adjustment current is manually adjustable.

11. The PLL circuit of claim 10, wherein the analog calibration circuit further comprises a second voltage-to-current converter and a variable current or voltage bias for adjusting an input voltage for the second voltage-to-current converter.

12. A phase-locked loop (PLL) circuit, comprising:
a phase frequency detector;
a programmable charge pump coupled to an output of the phase frequency detector;
a loop filter coupled to an output of the charge pump, said loop filter providing a fine tuning voltage;
a first voltage-to-current converter, the first voltage-to-current converter providing a fine tuning current corresponding to the fine tuning voltage;
a current-controlled oscillator (CCO);
a feedback divider coupled to an output of the CCO and an input of the phase frequency detector; and
a digital calibration circuit for automatically providing a coarse adjustment current for coarse adjustments to a frequency pivot point for an oscillator frequency of the CCO, wherein the CCO generates a frequency signal at an output responsive to the coarse adjustment and fine tuning currents, wherein the frequency pivot point is incrementally adjustable.

13. The PLL circuit of claim 12, wherein the digital calibration circuit is configured to automatically adjust the frequency pivot point responsive to the fine tuning voltage being outside of a range defined between a pair of predetermined reference voltages.

14. The PLL circuit of claim 13, wherein a first one of the predetermined reference voltages is a low reference voltage and a second one of the predetermined reference voltages is a high reference voltage, wherein the digital calibration circuit comprises:
a sensing circuit for sensing if the fine tuning voltage is above the high reference voltage or below the low reference voltage; and
a state machine responsive to an output of the sensing circuit for providing a digital control signal for setting the coarse adjustment current.

15. The PLL circuit of claim 14, wherein the sensing circuit comprises a first comparator having an input coupled to the low reference voltage and a second comparator having and input coupled to the high reference voltage, and the state machine is responsive to outputs from the first and second comparators.

16. The PLL circuit of claim 14, wherein the state machine is configured to adjust the digital control signal to increase the coarse adjustment current if the fine tuning voltage is below the low reference voltage and decrease the coarse adjustment current if the fine tuning voltage is above the high reference voltage.

17. The PLL circuit of claim 14, wherein the digital control signal comprises a plurality of calibration bits, the PLL circuit comprising a coarse adjustment module for providing the coarse adjustment current responsive to the calibration bits, the coarse adjustment module comprising a plurality of selectable voltage-to-current converters, the selectable voltage-to-current converters being selectable using the calibration bits to individually contribute current to the coarse adjustment current.

18. A method of bringing a current-controlled oscillator (CCO)-based phase-locked loop (PLL) to lock, the CCO generating a frequency signal at an output responsive to a fine tuning current corresponding to a fine tuning voltage from a loop filter, comprising the steps of:
providing a coarse adjustment current for coarse adjustments to a frequency pivot point for an oscillation frequency of the CCO;
sensing with a sensing circuit if the fine tuning voltage is outside of a range defined between a pair of predetermined reference voltages;
if the fine tuning voltage is outside of the range, adjusting the coarse adjustment current to move the frequency pivot point to bring the fine tuning voltage within the range.

19. The method of claim 18, wherein the frequency pivot point is continuously adjustable.

20. The method of claim 18, further comprising the step of setting the coarse adjustment current to an initial value corresponding to a predetermined initial oscillation frequency of the CCO.

* * * * *